United States Patent [19]

Schweitzer, Jr.

[11] Patent Number: 4,794,331
[45] Date of Patent: Dec. 27, 1988

[54] CIRCUIT CONDITION MONITORING SYSTEM HAVING INTEGRAL TEST POINT

[76] Inventor: Edmund O. Schweitzer, Jr., 2433 Center St., Northbrook, Ill. 60062

[21] Appl. No.: 115,166

[22] Filed: Oct. 30, 1987

[51] Int. Cl.⁴ ............................................. G01R 19/14
[52] U.S. Cl. .................................... 324/133; 439/279
[58] Field of Search .............. 324/538, 133; 439/278, 439/279, 281

[56] References Cited

U.S. PATENT DOCUMENTS

| | | | |
|---|---|---|---|
| 3,513,394 | 5/1970 | Tachnick | 324/133 |
| 3,656,057 | 4/1972 | De Luca et al. | 324/133 |
| 3,725,846 | 4/1973 | Strain | 439/279 |
| 4,152,643 | 5/1979 | Schweitzer, Jr. | 324/133 |

Primary Examiner—Reinhard J. Eisenzopf
Assistant Examiner—Maura K. Regan
Attorney, Agent, or Firm—Lockwood, Alex, FitzGibbon & Cummings

[57] ABSTRACT

A circuit condition monitoring system for an electrical power distribution system includes a connector component having an integrally formed test point which provides fault current or voltage loss monitoring of a conductor within the connector. The connector includes an electrically conductive outer sheath layer. An annular channel formed on the surface of and extending through this layer receives the cylindrical end of a circuit monitoring module to form an electrically-isolated sheath portion which is capacitively coupled to the system conductor and to the module to function as a test point for providing operating power to the module. An electrically conductive end cap may be provided to cover the test point when a module is not installed.

17 Claims, 4 Drawing Sheets

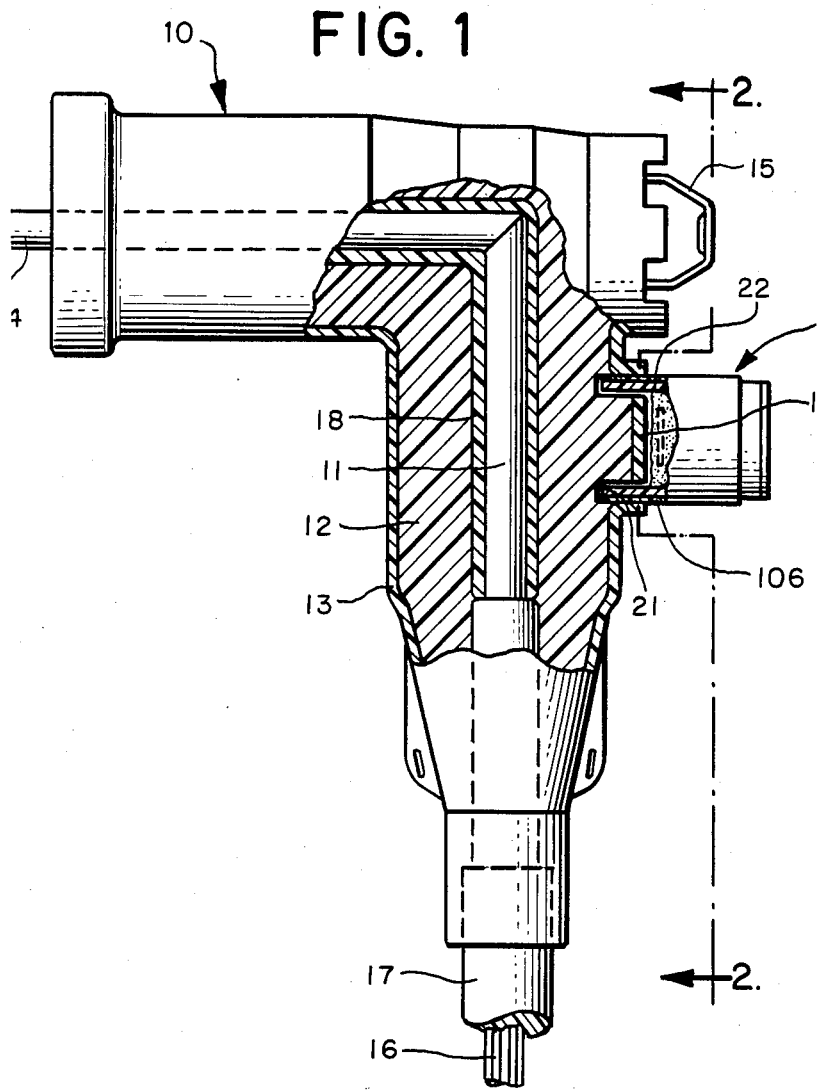
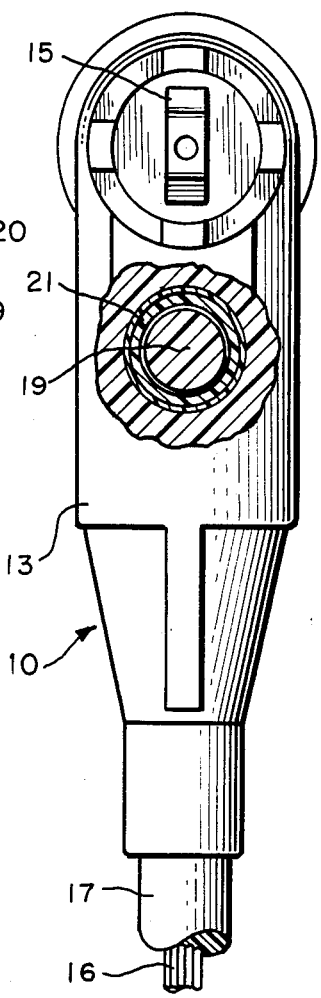
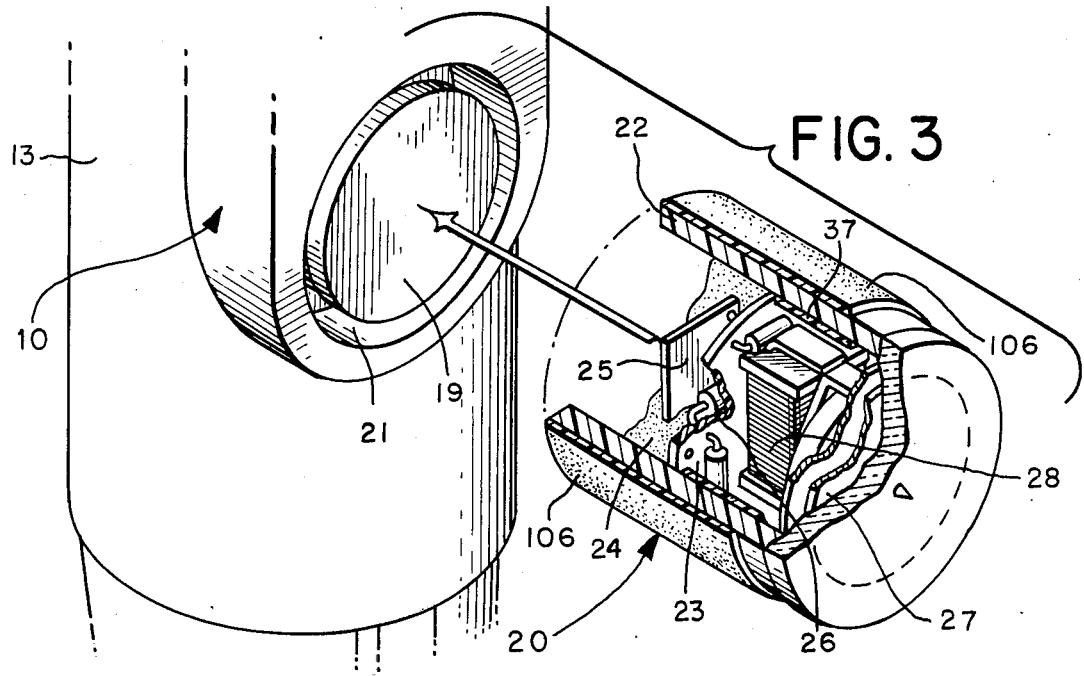

CIRCUIT CONDITION MONITORING SYSTEM HAVING INTEGRAL TEST POINT

BACKGROUND OF THE INVENTION

The present invention is directed generally to circuit condition monitoring systems for power distribution systems, and mrre particularly to a connector component for such systems having a non-metallic test point integrally formed therein for receiving a circuit condition monitoring module.

In the operation of electrical power distribution systems it is frequently necessary to monitor circuit parameters such as current and voltage at a particular location to detect the occurrence of a fault current or loss of voltage at the location. To this end, distribution systems have been provided with test points at various locations by means of which monitoring devices such as fault indicators are capacitively coupled to conductors of the systems. Typically, such test points have been in the form of exposed metallic contacts imbedded in the housing of a system connector component, such as the elbow-type connectors typically used for connecting a system cable to the terminal of a system component, such as a transformer or relay, and illustrated, for example, in U.S. Pat. Nos. 4,263,550 and 4,375,617 of the present inventor.

Various types of circuit condition indicating modules have been installed on such test points, including, for example, fault indicators as described in U.S. Pat. Nos. 4,234,847, 4,438,403, 4,424,512 and 4,458,198 of the present inventor, and voltage indicators as described in U.S. Pat. Nos. 4,152,643, 4,251,770, 4,550,288 and 4,641,220 of the present inventor.

One drawback of prior circuit condition monitoring system was the use of the metallic contact on the surface of the connector, which was perceived by some users as a shock hazard. One form of the monitoring system which provides a non-metallic test point in the form of a recessed socket which avoids the need for an exposed metallic contact is described in the copending application of the present inventor entitled "Circuit Condition Monitoring System", Ser. No. 062,875, filed June 16, 1987. The present invention is directed to an alternate form of non-metallic test point which is integrally formed on the surface of the system connector.

SUMMARY OF THE INVENTION

The invention is directed to a connector for establishing a electrical monitoring connection between electrical terminals of components of an electrical power distribution system. The connector includes a connector body formed of electrically non-conductive material, first and second terminal means for electrically and mechanically engaging the electrical terminals of the components, electrical conductor means extending within the body portion between the first and second terminal means for providing an electrical current path therebetween, the conductor means being substantially surrounded by the body portion, and a sheath formed of an electrically-conductive material overlying the surface of the body portion. Means define a channel in the sheath layer, the channel extending through the sheath layer and into the body portion and forming a closed loop, whereby an interior portion of the sheath layer is electrically isolated from the sheath layer and capacitively coupled to the conductor to provide the electrical monitoring connection.

The invention is further directed to a circuit condition monitoring system for an electrical power distribution system for providing a monitored connection between the terminls of electrical components of the distribution system. The system comprises a connector having a connector body formed of electrically non-conductive material, first and second terminal means for electrically and mechanically engaging the electrical terminals of the system components, electrical conductor means extending within the body between the first and second terminal means for providing an electrical current path therebetween, the conductor means being substantially surrounded by the body portion, and a sheath formed of an electrically-conductive material overlying the surface of the body portion. The system further comprises a circuit condition monitoring module which includes a monitoring circuit operable from a capactitive coupling to the conductor, the module including an internal capacitive coupling element at one end for establishing capacitive coupling to the conductor, and ground return means for establishing electrical coupling to the sheath layer. Means define a channel in the sheath layer, the channel ettending through the sheath layer and into the body portion and forming a closed loop dimensioned to receive the module, whereby an interior portion of the sheath layer is electrically isolated from the sheath layer and capacitively coupled to the conductor means to provide electrical coupling between the capacitive coupling element of the module and the monitored conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is a side elevational view partially in section of an elbow-type connector including an integral test point and installed fault indicator module constructed in accordance with the invention.

FIG. 2 is a cross-sectional view of the front of the elbow connector taken along line 2—2 of FIG. 1.

FIG. 3 is an enlarged exploded perspective view showing the integral test point and fault indicator.

DESCRIPTION OF THE PREFERRED EMBODIMENT

Figure 4:
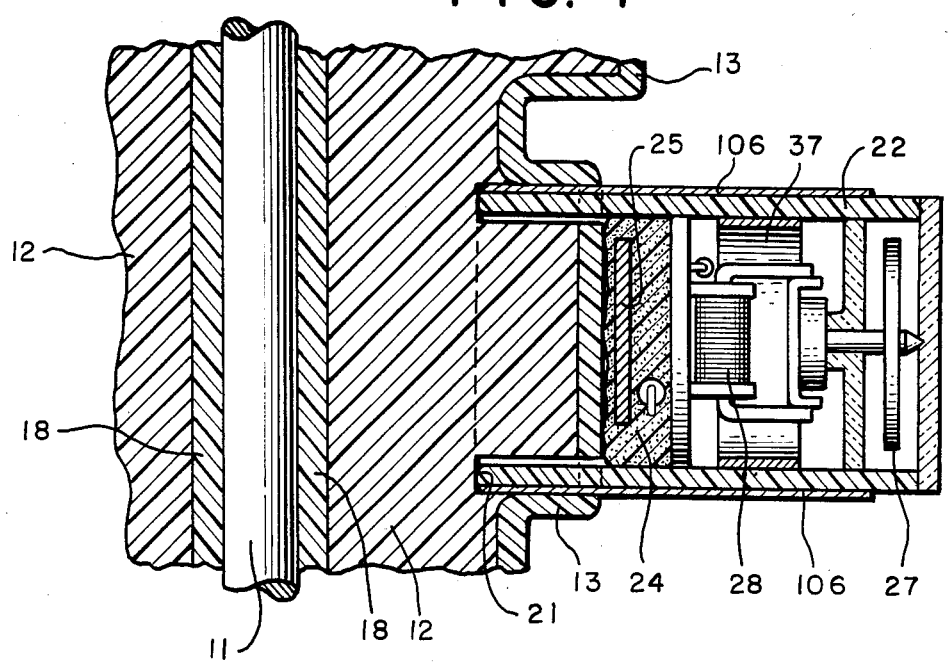
FIG. 4 is an enlarged cross-sectional view showing the integral test point and installed fault indicator module shown in of FIGS. 1–3.

Referring to the drawings, and particularly to FIGS. 1-4, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact (not shown) on the associated system component. An arcuate member 15 having ends anchored in the conductive sheath 13 extends from the connector to receive the hooked end of a lineman's tool. The axial conductor 11 is connected, in accordance with conventional practice, to the conductor 16 of a flexible cable 17 of the type commonly utilized in power distribution systems. A layer 18 of semi-conductive material may be provided around conductor 11 to provide stress relief within the conductor in a manner well known to the art.

To provide for detecting fault currents or voltage loss in conductor 11 connector 10 includes, in accordance with the invention, an integral test point 19 for supplying operatin power to a circuit condition indicating module, in this case a fault indicator module 20. The test point 19 is formed by a poriion of the electrically-conductive outer sheath 13 which is electrically isolated from the sheath by a channel 21 which extends through the sheath into the central body portion 12 of the connector. In particular, channel 21 is preferably arranged in a closed loop and dimensioned such that an annular test point socket is formed which receives a cylindrical projecting portion of the housing 22 of fault indicator module 20. Thus, when module 20 is seated in the test point socket as shown in FIG. 4 a sufficient portion of the module housing is received within the socket to support the module. Since test point 19 is formed in the electrically conductive sheath 13 portions of the sidewalls of the socket are electrically conductive. However, since the sheath layer does not extend across the bottom of channel 21 the test point 19 remains electrically isolated from the sheath layer.

The fault indicator module 20, which is representative of various other types of circuit condition monitoring modules which can be used in conjunction with the test point socket, is seen to include an electrically non-conductive transparent plastic housing 22 within which the electrical components of the fault indicator are contained. In particular, within housing 22 the fault indicator module includes a disc-shaped insulator board 23 positioned perpendicularly to the axis of the housing at a location intermediate the ends thereof, and a layer 24 of epoxy material at the inside end of the housing for securing the insulator board in place. Additional electrical components included in housing 22 include a first capacitive coupling element in the form of a metallic plate 25 for capacitively coupling the circuitry of the fault indicator to conductor 11, a reed switch 26 for sensing the occurrence of a fault current in the conductor, an electro-mechanically driven indicator flag assembly 27 for visually indicating the occurrence of a fault current through the transparent outside end of housing 22, and a magnetic winding assembly 28 for actuating the indicator flag assembly.

Operating power for the circuitry of fault indicator module 20 is derived from conductor 11 by means of the metallic plate 25, whic when module 20 is seated in the test point socket formed by channel 21 is sufficiently closely spaced to the isolated test point 19 to provide a level of capacitive coupling to the test point whereby adequate alternating voltage is derived from the conductor for operation of the fault indicator circuitry. A necessary ground return for this circuitry may be provided, as shown in FIGS. 1-4, by a ring-shaped electrode 37 within housing 22 which capacitively couples the circuitry of module 20 to electrical ground, as represented by the electrically conductive sheath of the connector.

Figure 6:
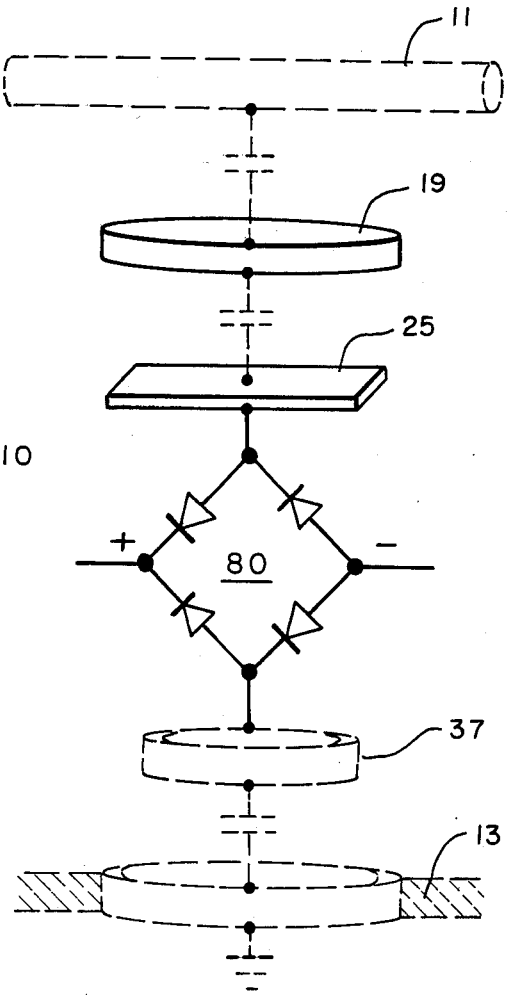
FIG. 6 is a simplified schematic depiction of the capacitive coupling provided by the integral test point for operating a circuit condition monitoring module installed thereon.

By reason of the novel construction of test point 19, connector 10 is provided iith a test point to which electrical connections can be made without the use of a metallic contact member, as in previous commercial embodiments, and without the use of an insert in a test point socket, as in the previously identified copending application of the present inventor. Instead, the connector has on its exterior surface only the test point integrally formed of electrically-conductive rubber sheath material. As shown in FIG. 6, a circuit condition monitoring module (such as fault indicator module 20) seated in channel 21 is automatically coupled by means of its internal metallic plate 25 to the test point, and hence to the conductor. The surrounding electrically-conductive sheath material 21 provides an efficient ground return path which may conveniently established by either direct connection, such as by a conductor on the exterior of housing 22, or by a second capacitive coupling element, such as ring 37.

With the exception of the provision of a projecting portion of the housing for insertion into channel 21, fault indicator module 20 may be conventional in construction and operation. In particular, to provide an indication of the occurrence of a fault current in conductor 11, the fault indicator includes, as part of tee previously identified flag indicator assembly 27, a disc-shaped target 65 which is mounted for rotation on a pivot 66. The face of the target disc has a red segment 65a (FIGS. 7-9) and a white segment 65b, only one of which is visible at a time through window 33 and the transparent end 34 of housing 22.

Figure 7A:
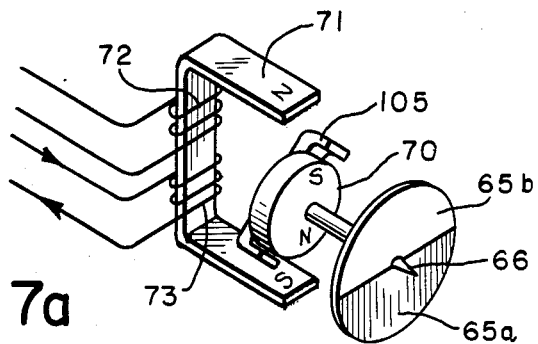
FIGS. 7a and 7b are diagrammatic views of the principal components of the indicator flag assembly of the fault indicator module in a reset state.
Figure 7B:
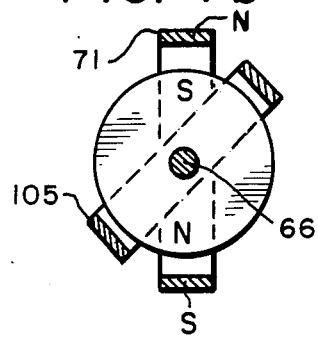
Figure 8A:
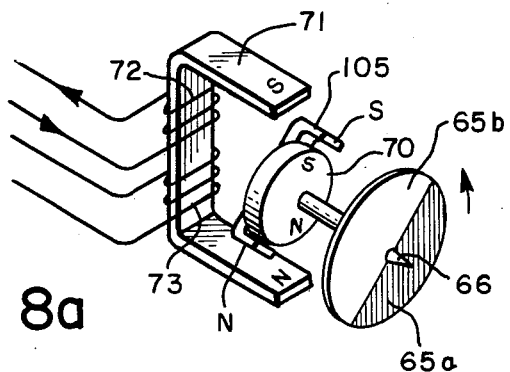
FIGS. 8a and 8b are diagrammatic views similar to FIGS. 7a and 7b, respectively, showing the principal components of the indicator flag assembly in transition between a reset state and a trip state.
Figure 8B:
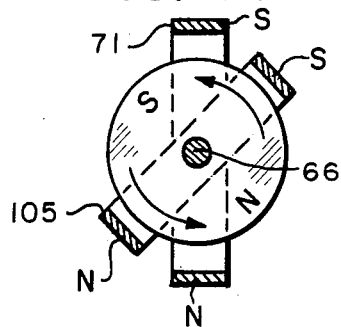

Secured to and pivotal with target 65 is a target permanent magnet 70, which is formed of a magnetic material having a high coercive force, such as ceramic, and is magnetically polarized to form two magnetic poles of opposite gender, as indicated in FIGS. 7-9, with opposite magnetic polarities along a diameter of the magnet. The target disc 65 and its permanent magnet 70 are biased to the position shown in FIGS. 10a and 10b when the fault indicator is in a non-tripped or reset condition by means of a stationary U-shaped magnetic pole piece 71, which is preferably formdd of a magnetic material having a relatively low coercive force, such as a chrome steel.

When the fault indicator is in a reset state, the projecting ends of the pole piece are biased to the magnetic polarities indicated in FIGS. 7a and 7b. As a result, the opposite polarity magnetic poles of the target magnet 70 are attracted to position the target disc 65 as shown. In this position the red segment 65a of the target disc is not visible through window 33, and all that is seen is the white segment 65b.

Figure 9A:
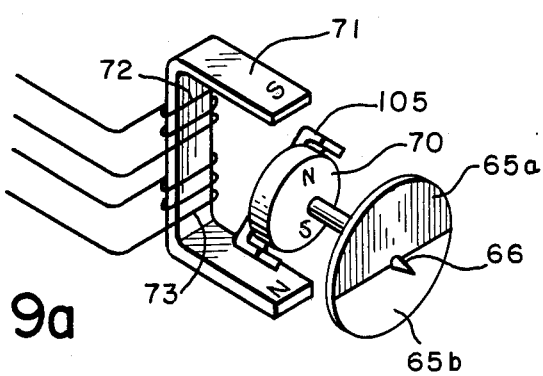
FIG. 9a and 9b are diagrammatic views similar to FIG. 7a and 7b, respectively, showing the principal components of the indicator flag assembly in a trip state.
Figure 9B:
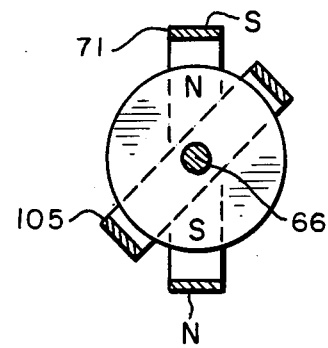

On the occurrence of a fault current in conductor 11, which fault current may, for example, exceed 400 amperes, pole piece 71 is remagnetized to the magnetic polarities shown in FIGS. 8 and 9 by momentary energization of a trip winding 72 on the center section of the pole piece. As a result, the poles of magnet 70 are repelled by the adjacent like gender poles of the pole piece and the target disc is caused to rotate 180° to the tripped position shown in FIGS. 9a and 9b. In this position, the red segment 65a of the target disc is visible through window 33, and a lineman viewing the fault indicator is advised that a fault current has flowed through conductor 11.

The target disc remains in the fault indicating position until the ends of pole piece 71 are subsequently remagnetized to the magnetic polarities shown in FIGS. 7a and 7b by momentary energization of a reset winding 73 on the enter section of the pole piece. As a result, the target magnet 70, and hence the target disc 65, are caused to rotate from the tripped position shown in FIG. 9b to the reset position shown in FIG. 7b and the fault indicator is conditioned to respond to a subsequent fault current.

Energization of winding 72 upon occurrence of a fault current in conductor 11, and energization of winding 73 upon restoration of current in conductor 11 following a fault, is accomplished by means of circuitry contained within the fault indicator housing 22.

Figure 10:
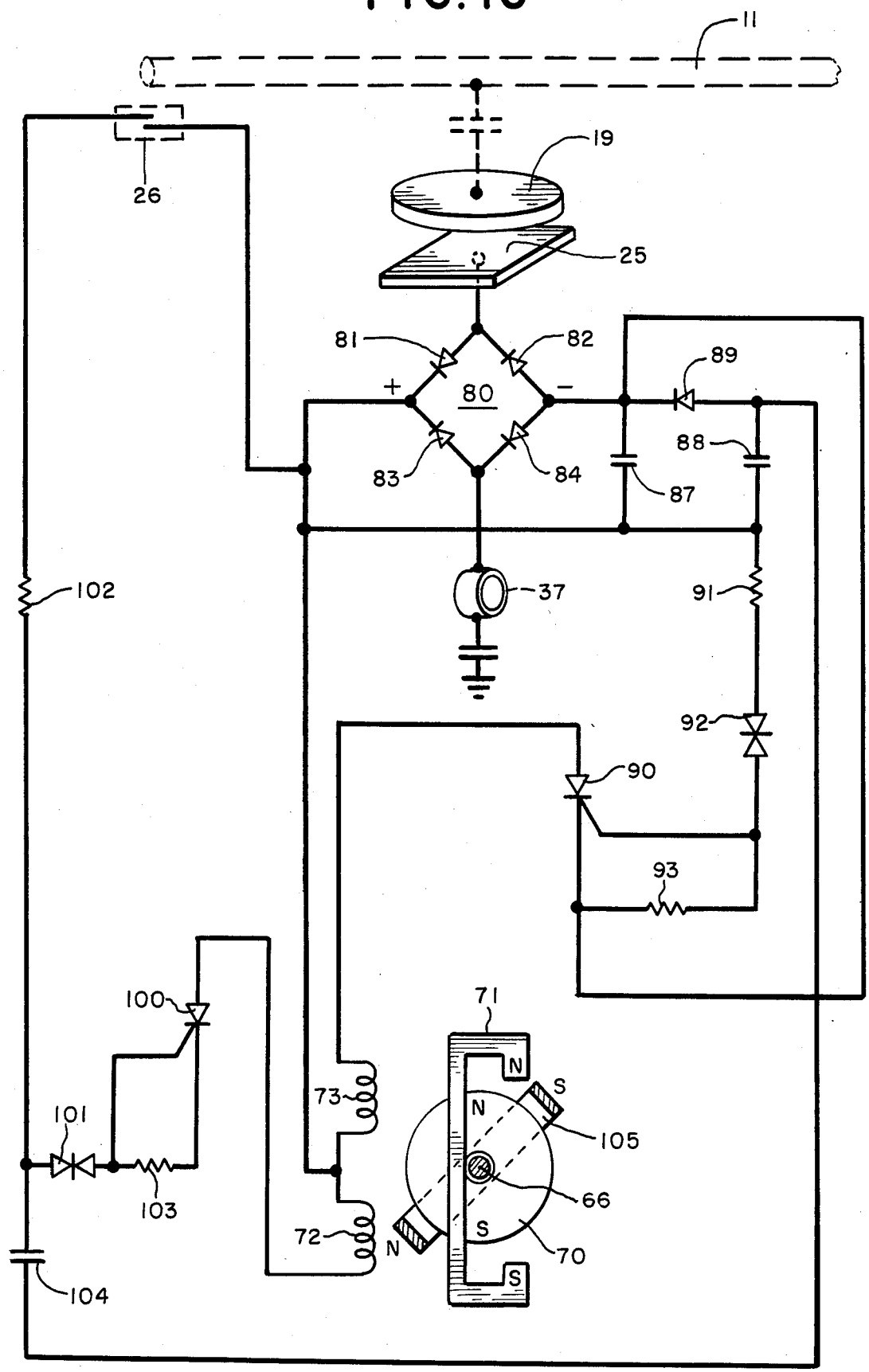
FIG. 10 is an electrical schematic diagram of the circuitry of the fault indicator module of FIGS. 1-4.

Referring to the schematic diagram shown in FIG. 10, windings 72 and 73 are connected end-to-end for independent energization upon occurrence of fault and reset conditions, respectively. Operating power for these windings is obtained by means of a bridge rectifier network 80, consisting of diodes 81-84. One input terminal of this network, formed at the juncture of the anode of diode 81 and the cathode of diode 82, is connected to the capacitive coupling plate 25. The other input terminal, formed at the juncture of the anode of diode 83 and the cahhode of diode 84, is coupled to ground through the electrically conductive sheath 13 of connector 10, either by direct connection, or by capacitive coupling, as shown in FIGS. 1-4. With this arrangement, high voltage alternating current carried in conductor 11 is capacitively coupled to the bridge rectifier network, resulting in the production of a pulsating unidirectional current at the output terminals of the network.

The positive polarity output terminal of the bridge rectifier network, formed at the cathodes of diodes 81 and 83, is connected to one contact of reed switch 26, to the end terminals of windings 72 and 73, and to respective terminals of capacitors 87 and 88. The negative polarity output terminal of the bridge rectifier network, formed at the juncture of the anodes of diodes 82 and 84, is connected directly to the remaining terminal of capacitor 87, and through a forward-biased diode 89 to the remaining terminal of capacitor 88. With this arrangement, capacitors 87 and 88 are charged by the pulsating unidirectional current developed by bridge rectifier network 80 in the presence of voltage on conductor 11.

To provide for periodic energization of reset winding 73 during normal current flow in conductor 11, the remaining end terminal of winding 73 is connected through a silicon controlled rectifier (SCR) 90 to the negative polarity terminal of capacitor 87. Periodic conduction through SCR 90 is obtained by connecting the gate electrode of that device to the positive polarity output terminal of bridge rectifier network 80 through a resistor 91 and a bilateral diode 92, and to the cathode of SCR 90 by a resistor 93. With this arrangement, SCR 90 is periodically triggered into conduction when the voltage developed across bilateral diode 92 as a result of capacitor 87 being charged by bridge rectifier 80 reaches the threshold level of the bilateral diode.

In operation, under normal current flow conditions, the voltage developed across capacitor 8 as the capacitor is charged by bridge rectifier network 80 progressively increases with time, until the threshold breakdown voltage of bilateral diode 92 is reached, at which time SCR 90 is triggered and capacitor 87 discharges through winding 73. Diode 89 prevents capacitor 88 from being discharged through SCR 90 and winding 73, leaving the capacitor available for energizing winding 72 in response to a fault condition. In practice, the breakdown voltage of bilateral diode 92 may be in the order of 34 volts, and the time required for capacitor 88 to reach this threshold level with a voltage level of 4,400 volts on conductor 11 may be approximately 2 minutes. In any case, the voltage level within conductor 11 is not critical to the operation of the reset circuit, and has only the effect of changing the frequency of the reset cycle.

Trip winding 72 is energized upon occurrence of a fault current in conductor 11 by discharge of capacitor 88 through a second silicon controlled rectifier 100. Conduction is established through SCR 100 by closure of the contacts of reed switch 26, which is positioned within housing 22 so as to be in proximity to conductor 11 when the module is seated on test point 19. The gate electrode of SCR 100 is connected through a bilateral diode 101 and a resistor 102 to the contacts of reed switch 26, and by a resistor 103 to the SCR cathode. The juncture of resistor and bilateral diode 104 is connected by a capacitor 104 to capacitor 88.

Upon occurrence of a fault current in conductor 11, the positive polarity output terminal of bridge rectifer network 80 is connected through the then closed contacts of reed switch 26 and the circuit comprising resistor 102, bilateral diode 101, resistor 103, and capacitor 104 to the gate electrode of SCR 100, causing that device to be rendered conductive following a predetermined time delay. At this time capacitors 87 and 88 are caused to discharge through SCR 100 and energize winding 82. The resulting magnetic flux in the U-shaped pole piece 71 reverses the magnetic pole polarities of the pole piece and causes rotation of the target as previously described.

To avoid the possibility of rotor 85 becoming stalled upon reversal of the magnetic polarities of pole piece 71, as might happen with a rotor being perfectly centered between the poles of pole pieces 71 and having a degree of bearing friction, the fault indicator includes an auxiliary U-shaped pole piece 105 positioned adjacent target means 70 coaxial with and at an angle to pole piece 71.

The existence of a magnetic field between the poles of pole piece 71 results in the production of induced magnetic poles on auxiliary pole piece 105 of opposite gender to the most adjacent poles of pole piece 71. This is illustrated in FIGS. 7-9 and results by reason of the auxiliary pole piece 105 becoming included in he magnetic flux path between the poles of pole piece 71. The effect of the induced magnetic poles is that upon reversal of the gender of the poles of pole piece 80 following occurrence of a fault current the auxiliary poles exert a rotational force on the most adjacent poles of the permanent rotor magnet 70 associated with target 65. This results in a rotational moment being exerted on the target, tending to turn the target in a predetermined (counter-clockwise in FIGS. 7-9) direction such that the target is precluded from remaining in its reset position, even if it should be perfectly positioned and have a degree of bearing friction. Once rotation has been established, as shown in FIG. 8, the greater force of the main pole piece 71 overcomes the effect of the auxiliary pole piece 105 and rotation continues until the target is aligned as shown in FIG. 9.

Other fault indicator circuits having different or additional operating features, such as the fault indicator circuits described in the copending applications of the present inventor, Ser. No. 042,282, filed Apr. 24, 1987, entitled "Fault Indicator Having Delayed Trip Circuit", and Ser. No. 518,535, filed Aug. 29, 1983 entitled, "Fault Indicator Having Trip Inhibit Circuit", may be utilized in place of the circuit shown.

In the illustrated embodiment a brass ring or cylinder 106 on the inside surface of housing 22 is provided to establish electrical communication with sheath 13. In particular, this ring capacitively couples the fault indicator circuitry through the housing wall to the sheath layer 13, which is connected to ground. Thus, the requisite ground return path is established without an external contact on the housing. While a ring-shaped coupling element 37 has been shown, it will be appreciated that other constructions for this element are possible, including a single plate positioned against the inside surface of the module housing.

Where desired an electrically conductive ground potential surface 106 can be provided on the outside surface of module housing 22. To this end, a thin resistive coating of conductive paint or rubber can be deposited on or otherwise applied to the outside surface where it will come into electrical communication with the electrically conductive outer sidewall of the channel 21 formed in sheath layer 13.

Figure 5:
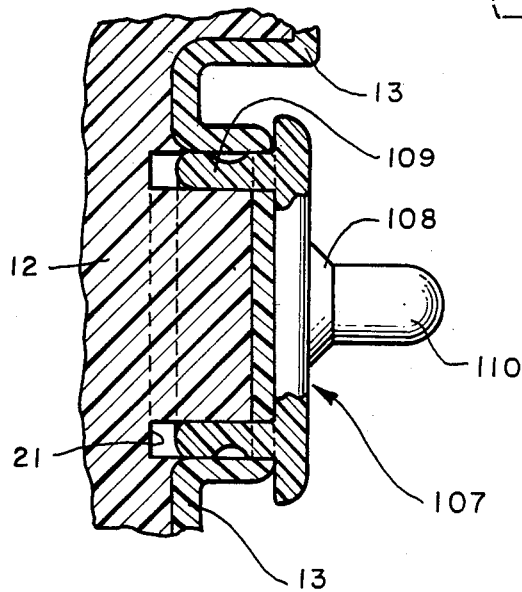
FIG. 5 is an enlarged cross-sectional view showing the integral test point with a protective cap installed thereon.

When the test point socket is not in use it may be desirable to install a plug member in channel 21 to prevent the collection of dirt in the channel. As shown in FIG. 5, the plug member, generally designated 107, may comprise an electrically conductive rubber body 108 having a cylindrical projecting portion 109 formed therein for engaging channel 21, and a projecting handle portion 110.

The components of the circuit condition monitoring system of the invention may be manufactured using conventional tehhniques and materials. In particular, connector 10 may have an insulating layer formed of EPDM material and a conductive sheath formed of the same material impregnated with carbon. The module housing may be formed of Lexan (Trademark of General Electric Company) or an acrylic.

A system has been shown which provides an integral test point in a connector by which high impedance electrical communication is established with a monitored conductor without the need for exposed electrical contacts or exposed sockets, and without the need for additional connector elements, thereby simplifying manufacture and reducing unit costs.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A connector for establishing an electrical monitoring connection between the electrical terminals of components of an electrical distribution system, comprising:
    a connector body portion formed of electrically non-conductive material;
    first and second terminal means for electrically and mechanically engaging the electrical terminals of said components;
    electrical conductor means extending within said body portion between said first and second terminal means for providing an electrical current path therebetween, said conductor means being substantially surrounded by said body portion;
    sheath layer formed of an electrically-conductive material overlying the surface of said body portion; and
    means defining a channel in said sheath layer, said channel extending through said sheath layer and into said body portion and forming a closed loop whereby an interior portion of said sheath layer is electrically isolated from said sheath layer and capacitively coupled to said conductor means to provide said electrical monitoring connection.

2. A connector as defined in claim 1 wherein said channel is formed into an annular loop.

3. A connector as defined in claim 2 wherein said channel is generally cylindrical in form and projects generally radially relative to said conductor.

4. A connector as defined in claim 3 wherein substantial portion of the sidewalls of said channel are formed of electrically conductive material.

5. A connector as defined in claim 1 wherein said connector body includes a generally cylindrical portion, and said conductor means are disposed generally axially therein, and said electrically conductive sheath comprises a coaxial layer overlying said generally cylindrical portion.

6. A connector for an electrical power distribution system for establishing an electrical monitoring connection between terminals on one or more components of the system, comprising:
    a connector body including a generally cylindrical portion formed of electrically non-conductive material;
    first and second terminal means for electrically and mechanically engaging the component terminals;
    electrical conductor means extending generally axially within said cylindrical portion between said first and second terminal means for providing an electrical current path therebetween, said conductor means being surrounded by said cylindrical body portion;
    a concentric sheath layer formed of electrically-conductive material overlying said cylindrical body portion; and
    means defining on the surface of said sheath layer a channel extending in a closed loop through said sheath layer to said body portion, said channel defining a central portion of said sheath layer electrically isolated from said sheath layer and capacitively coupled to said conductor for providing said electrical monitoring connection.

7. A connector as defined in claim 6 wherein substantial portion of the sidewalls of said channel are formed of electrically conductive material.

8. A circuit condition monitoring system for an electrical power distribution system providing an electrical monitoring connection btween the terminals of electrical components within the distribution system, comprising:
   a connector body formed of electrically non-conductive material;
   first and second terminal means for electrically and mechanically engaging the component terminals;
   electrical conductor means extending within said body between said first and second terminal means for providing an electrical current path therebetween, said conductor means being substantially surrounded by said body;
   a sheath layer formed of an electrically-conductive material overlying the surface of said body;
   a circuit condition monitoring module including a monitoring circuit operable from a capactive coupling to said conductor;
   means defining a channel in said sheath layer, said channel extending through said sheath layer and into said body portion and forming a closed loop dimensioned to receive said module, and whereby an interior test point portion of said sheath layer is electrically isolated from said sheath layer and capacitively coupled to said conductor means; and
   said module including an internal capacitive coupling element at one end for establishing a capacitive coupling to said test point portion and electrical coupling to said monitored conductor.

9. A monitoring system as defined in claim 8 wherein said ground return means comprise an additional capacitive coupling element.

10. A connector as defined in claim 8 wherein said channel is formed into an annular loop.

11. A connector as defined in claim 10 wherein said channel is generally cylindrical in form and projects generally radially relative to said conductor.

12. A connector as defined in claim 11 wherein substantial portion of the sidewalls of said channel are formed of electrically conductive material.

13. A connector as defined in claim 8 wherein said connector body includes a generally cylindrical portion, and said conductor means are disposed generally axially therein, and said electrically conductive sheath comprises a coaxial layer overlying said generally cylindrical portion.

14. A monitoring system as defined in claim 8 wherein said connector body includes a generally cylindrical portion, and said conductor means are disposed generally axially therein, said electrically conductive sheath layer comprises a coaxial layer overlying said generally cylindrical portion, and said test point socket extends through said sheath such that at least a substantial portion of the bottom of said socket is formed by said non-conductive housing material.

15. A monitoring system for providing an electrical monitoring connection between the terminals of electrical components within an electrical power distribution system, comprising:
   a connector body including a generally cylindrical portion formed of electrically non-conductive material;
   first and second terminal means for electrically and mechanically engaging the component terminals;
   electrical conductor means extending generally axially within said cylindrical portion between said first and second terminal means for providing an electrical current path therebetween, said conductor means being surrounded by said cylindrical body portion;
   a concentric sheath layer formed of electrically-conductive material overlying said cylindrical body portion;
   means defining a channel in said sheath layer, said channel extending through said sheath layer and into said body portion and forming a closed loop dimensioned to receive said module, whereby an interior portion of said sheath layer is electrically isolated from said sheath layer and capacitively coupled to said conductor to provide a test point; and
   a circuit condition monitoring module including a monitoring circuit operable from a capacitive coupling to said conductor, said module including an internal capacitive coupling element at one end for establishing when said module is seated in said socket said capacitive coupling to said conductor, and ground return means for establishing electrical coupling to said sheath layer.

16. A monitoring system as defined in claim 15 wherein said ground return means comprise an additional capacitive coupling element.

17. A monitoring system as defined in claim 15 wherein said ground return means comprise a metallic connection to said sidewall of said test point socket.

* * * * *